United States Patent [19]

Jonkheere

[11] Patent Number: 6,146,807

[45] Date of Patent: Nov. 14, 2000

[54] METHOD FOR PREPARING AN IMAGING ELEMENT FOR MAKING AN IMPROVED PRINTING PLATE ACCORDING TO THE SILVER SALT DIFFUSION TRANSFER PROCESS

[75] Inventor: Marcus Jonkheere, Oostkamp, Belgium

[73] Assignee: Agfa-Gevaert, N.V., Mortsel, Belgium

[21] Appl. No.: 09/435,210

[22] Filed: Nov. 5, 1999

Related U.S. Application Data

[60] Provisional application No. 60/119,072, Feb. 8, 1999.

[30] Foreign Application Priority Data

Nov. 23, 1998 [EP] European Pat. Off. ............. 98203954

[51] Int. Cl.$^7$ ................................ G03F 7/07; G03C 8/28; G03C 8/52; G03C 11/22
[52] U.S. Cl. .......................... 430/204; 430/227; 430/230; 430/231; 430/278; 430/278.1; 430/526; 430/935; 101/459
[58] Field of Search ..................................... 430/204, 227, 430/230, 231, 935, 278.1, 526; 101/459

[56] References Cited

U.S. PATENT DOCUMENTS 4,116,695  9/1978  Mori et al. ............................... 101/459
5,645,972  7/1997  Jonkheere ................................ 430/204
6,027,851  2/2000  Coppens et al. ......................... 430/204
6,040,109  3/2000  Coppens et al. ......................... 430/204
6,054,247  4/2000  Jonckheere .............................. 430/204
6,071,668  6/2000  Jonckheere .............................. 430/204

FOREIGN PATENT DOCUMENTS 0 658 809 A1  6/1995  European Pat. Off. .
0 770 911 A1  5/1997  European Pat. Off. .

*Primary Examiner*—Richard L. Schilling
*Attorney, Agent, or Firm*—Breiner & Breiner

[57] ABSTRACT

According to the present invention there is provided a method for preparing a silver salt diffusion transfer imaging element comprising the steps of coating in the order given on a grained and anodized side of an aluminum support (i) an image receiving layer containing physical development nuclei, (ii) a photosensitive layer containing a silver halide emulsion in water permeable relationship with said image receiving layer and (iii) optionally an antistress layer in water permeable relationship with said image receiving layer, characterized in that said aluminum support, provided with said image receiving layer, is kept at a relative humidity of at least 45% in an area of a machine, the said area being ahead of a coating head used for coating said photosensitive layer.

7 Claims, No Drawings

METHOD FOR PREPARING AN IMAGING ELEMENT FOR MAKING AN IMPROVED PRINTING PLATE ACCORDING TO THE SILVER SALT DIFFUSION TRANSFER PROCESS

Priority is claimed under 35 USC 119 (E) based on provisional application Ser. No. 60/119,072 filed Feb. 8, 1999.

FIELD OF THE INVENTION

The present invention relates to a method for preparing a silver salt diffusion transfer imaging element for making a printing plate.

More specifically the invention is related to a method for preparing a silver salt diffusion transfer imaging element for making a printing plate with improved lithographic properties.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two main types of mono-sheet DTR materials that are distinct because of their different layer arrangement and processing are known. The first type of mono-sheet DTR material comprises on a support, generally paper or a resin support such as polyester, in the order given a silver halide emulsion layer and an image receiving layer containing physical development nuclei as a surface layer. After information-wise exposure and development according to the DTR process a silver image is formed in the surface layer. Since the underlying layers are hydrophilic in nature and the silver image formed on the surface is hydrophobic or can be renderred hydrophobic the thus obtained plate can be used without further processing. These type of printing plates have a low printing endurance typically around 10000 copies.

On the other hand mono-sheet DTR materials are known that comprise a hydrophilic support provided with an image receiving layer containing physical development nuclei and on top thereof a silver halide emulsion layer. After information-wise exposure and development according to the DTR-process a silver image is formed in the image receiving layer. In order to obtain a lithographic printing plate it will then be necessary to remove the now useless silver halide emulsion layer to expose the silver image formed in the image receiving layer. Said removal is generally carried out by rinsing the element with cold or warm water. This type of printing plate is disclosed in e.g. EP-A- 278 766, EP-A- 483 415 and EP-A- 410 500.

As a preferred support for the latter type of printing plates a roughened and anodized aluminum foil is used and high printing endurances can in principal be obtained. Such type of supports are well known for preparing printing plates using an imaging element having as a light sensitive coating photopolymers (hereinafter called PS-plates) instead of silver halide and are disclosed in e.g. DE-P- 3 717 757, EP-A- 167 751, DE-P- 3 036 174, U.S. Pat. No. 4,336,113, U.S. Pat. No. 4,374,710, U.S. Pat. No. 3,980,539, U.S. Pat. No. 3,072,546, U.S. Pat. No. 3,073,765, U.S. Pat. No. 3,085,950, U.S. Pat. No. 3,935,080 and U.S. Pat. No. 4,052,275.

However the requirements imposed on the aluminum foils for use as supports for PS-plates are different from the requirements imposed on the aluminum foils for use in the silver salt diffusion transfer process. Indeed, commonly employed aluminum foils as supports for PS-plates are not suited for preparing printing plates according to the silver salt diffusion transfer process.

In order to obtain printing plates according to the DTR process having good printing properties i.e. good ink acceptance in the image areas, no ink acceptance in the non-image areas called staining or toning and high printing endurances it is required that the adhesion of the image receiving layer containing the physical development nuclei and the other layers to the aluminum foil is overall firm. Recently it has been observed that during the coating with the different layers tiny gas-bubbles are formed on the aluminum support. This results after development in white spots in the printing area. Plates with these defaults, wich have a diameter of 0.1 to 1 mm yield prints of low quality. So, a solution for said defaults is required.

OBJECTS OF THE INVENTION

It is an object of the present invention to provide a method for preparing an aluminum based mono-sheet DTR material for preparing a lithographic printing plate having good printing properties.

It is a further object of the present invention to provide a method for preparing an aluminum based monosheet DTR material which shows after image-wise exposure and development no white spots on the image areas.

Further objects of the present invention will be clear from the description hereinafter.

SUMMARY OF THE INVENTION

According to the present invention there is provided a method for preparing a silver salt diffusion transfer imaging element comprising the steps of coating in the order given on a grained and anodized side of an aluminum support (i) an image receiving layer containing physical development nuclei, (ii) a photosensitive layer containing a silver halide emulsion in water permeable relationship with said image receiving layer and (iii) optionally an antistress layer in water permeable relationship with said image receiving layer, characterized in that said aluminum support, provided with said image receiving layer, is kept at a relative humidity of at least 45% in an area of a machine, the said area being ahead of a coating head used for coating said photosensitive layer.

DETAILED DESCRIPTION OF THE INVENTION

The area of a coating machine ahead of the coating head is also called the unwinding area. In this area the element to be coated is led over different rollers, preferably at least one roller being conductive and earthened ahead of being led to the coating head. The conductive roller consist of a metal. The earthening is preferably at least one brush, preferably of carbon or a well conducting metal. The aluminum support is kept at least 5 s in said area, more preferably at least 10 s, most preferably at least 15 s. Said aluminum support, provided with said image receiving layer is preferably held in the area of the machine, used for coating the photosensitive layer, ahead of said coating head at a relative humidity of preferably at least 55%, more preferably of at least 60%.

The present invention provides an imaging element comprising in the order given on a grained and anodized side of an aluminum support (i) an image receiving layer containing physical development nuclei, (ii) a photosensitive layer containing a silver halide emulsion being in water permeable relationship with said image receiving layer and (iii) optional an antistress layer being in water permeable relationship with said image receiving layer.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

Graining and anodization of the foil are necessary to obtain a lithographic printing plate that allows to produce high-quality prints in accordance with the present invention. Sealing is not necessary but may still improve the printing results. Preferably the aluminum support has 500 or more pits per 100 $\mu m^2$, diameters of the pits being 0.03 to 0.30 $\mu m$ and an average diameter of the pits being 0.05 to 0.20 $\mu m$. Preferably the aluminum foil has a roughness with a CLA value between 0.2 and 1.5 $\mu m$, an anodization layer with a thickness between 0.4 and 2.0 $\mu m$ and is posttreated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an alkali. The chemical etching is preferably carried out at a temperature of at least 25° C. more preferably at least 30° C. The chemical etching step can also be carried out by treatment with an acidic aqueous solution at a temperature of at least 40° C., more preferably of at least 50° C.

After roughening and optional chemical etching the aluminum foil is anodized which may be carried out as follows.

An electric current is passed through the grained aluminum foil immersed as an anode in a solution containing an acid. An electrolyte concentration from 1 to 70% by weight can be used within a temperature range from 0–70° C. The anodic current density may vary from 1–50 A/dm$^2$ and a voltage within the range 1–100 V to obtain an anodized film weight of 1–8 g/m$^2$ Al$_2$O$_3$.H$_2$O. The anodized aluminum foil may subsequently be rinsed with demineralised water within a temperature range of 10–80° C.

After the anodizing step a posttreatment may be applied to the anodic surface. Posttreatment of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", Jan. 24, 1980, under the title "Sealing-kwaliteit en sealing-controle van geanodiseerd Aluminium". Different types of posttreatment of the porous anodized aluminum surface exist.

Preferably, said posttreatment is performed by treating a grained and anodized aluminum support with an aqueous solution containing a bicarbonate as disclosed in EP-A- 567 178 or by treating with a solution of polyvinyl phosphonic acid.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu- 58/14 797.

Subsequent to the preparation of the aluminum foil as described above the aluminum foil may be immediately coated with a solution containing the physical development nuclei or may be coated with said solution at a later stage.

The image receiving layer containing physical development nuclei is preferably free of hydrophilic binder but may comprise small amounts upto 80% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The aluminum support according to the present invention is especially suited for preparing a mono-sheet DTR material. According to the method of the present invention for obtaining a mono-sheet DTR material an aluminum foil prepared as described above and provided with an image receiving layer is provided with a photosensitive layer in water permeable contact with said image receiving layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 $\mu$m , preferably from 0.25 to 0.45 $\mu$m.

Preferably during or after the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P- 493 464 and 568 687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A- 554 585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPa.s at a shearing rate of 1000 s $^{-1}$ combined with a gelatin of a higher viscosity. The weight ratio of said low viscosity gelatin versus the gelatin of a higher viscosity is preferably >0.5.

Preferably the gelatin layer(s) is(are) unhardened. Unhardened means that when such gelatin layer is coated on a subbed polyethylene terephtalate film base at a dry thickness of 1.2 g/m$^2$, dried for 3 days at 57° C. and 35% R.H. and dipped in water of 30° C., said gelatin layer is dissolved for more than 95% by weight within 5 minutes.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned intermediate layers. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present.

The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P- 2 453 217.

More details about the composition, preparation and coating of silver halide emulsions suitable for use in accordance with the present invention can be found in e.g. Product Licensing Index, Vol. 92, December 1971, publication 9232, p. 107–109.

Preferably, the imaging element also comprises an intermediate layer between the image receiving layer and the photosensitive layer(packet) to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m$^2$ and comprising at least one non-proteinic hydrophilic film-forming polymer e.g. polyvinyl alcohol and optionally comprising an antihalation dye or pigment as disclosed in EP-A- 410 500.

In another embodiment, the intermediate layer is a layer comprising hydrophobic polymer beads having an average diameter not lower than 0.2 $\mu$m and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A- 483 415.

In still another embodiment, the intermediate layer is a layer comprising particles of a water insoluble inorganic compound having a number average size not lower than 0.1 $\mu$m. Preferably, said intermediate layer comprises said water insoluble inorganic compound in an amount of at least 0.1 g/m$^2$. Further details are disclosed in EP-A- 723 195.

In still another embodiment, the intermediate layer is a layer comprising particles of an alkali insoluble non-polymeric organic compound having a melting point of at least 50° C., said particles having a number average size between 0.1 $\mu$m and 10 $\mu$m. Preferably, said intermediate layer comprises said alkali insoluble non-polymeric organic compound in an amount of at least 0.1 g/m$^2$. Further details are disclosed in EP-A- 750 227.

In still another embodiment, the intermediate layer is a layer comprising particles of an alkali insoluble polymeric organic compound obtainable by polycondensation, said particles having a number average size between 0.02 $\mu$m and 10 $\mu$m. Preferably, said intermediate layer comprises said alkali insoluble polymeric organic compound obtainable by polycondensation in an amount of at least 0.1 g/m$^2$. Further details are disclosed in EP-A- 773 474.

All said intermediate layers may comprise pigment particles with a number average diameter between 0.2 and 1 $\mu$m such as CaCO$_3$, TiO$_2$, BaSO$_4$, Al$_2$O$_3$, SiO$_2$, ZnO$_2$, etc..

A supplemental intermediate layer, which may be present between said silver halide emulsion containing layer and said intermediate layer may incorporate one or more ingredients such as i.a. antihalation dyes or pigment, developing agents, silver halide solvents, base precursors, and anticorrosion substances.

The imaging element may optionally contains an upper layer (antistress layer) comprising gelatin and preferably at least 30 mg/m$^2$ of a matting agent with a weight average diameter larger than the mean roughness depth Rz of the grained and anodized side of the aluminum support which is coated with the above mentioned layer.

Said matting agent may be a water-insoluble, alkali soluble organic polymer or copolymer such as a copolymer of acrylic acid and methyl acrylate. More preferably said matting agent is a water insoluble inorganic compound such as silica. Most preferably said matting agent is an alkali-insoluble organic polymer or copolymer such as a polymer or copolymer of methyl (meth)acrylate. A particularly preferred matting agent is a copolymer of styrene, methyl methacrylate and maleic acid.

Preferably the matting agent has a weight average diameter larger than the mean roughness depth Rz of the grained and anodized side of the aluminum support which is coated with the above mentioned layers, preferably larger than 1.2 times said mean roughness depth, more preferably larger than 1.3 said mean roughness depth. The upper limit of the weight average diameter of said matting agent is not so important but is for practical reasons preferably not more than 15 $\mu$m, more preferably not more than 10 $\mu$m The mean roughness depth of a grained and anodized aluminum foil suitable as a support for an imaging element according to the present invention ranges preferably from 2 $\mu$m to 6 $\mu$m, more preferably from 2.5 $\mu$m to 5 $\mu$m.

Optionally to the invention said antistress layer comprises at least 30 mg/m$^2$ of a matting agent with a weight average diameter larger than said mean roughness depth, more preferably between 50 and 500 mg/m$^2$ of said matting agent, most preferably between 100 and 200 mg/m$^2$ of said matting agent.

Optionally the antistress layer comprises preferably unhardened gelatin or gelatin admixture preferably in an amount between 0.2 and 2 g/m$^2$, more preferably between 0.4 and 1.75 g/m$^2$, most preferably between 0.6 and 1.25 g/m$^2$.

Preferably at least 50%, more preferably at least 75%, most preferably at least 90% by weight of said unhardened gelatin or gelatin admixture belongs to one or more gelatin species whereof a 10% by weight aqueous solution at 36° C. and pH 6 has a viscosity lower than 35 mPa.s, more preferably lower than 30 mPa.s at a shearing rate of 1000 s$^{-1}$.

Said antistress layer can comprise more than one species of unhardened gelatin whereof a 10% by weight aqueous solution at 36° C. and pH 6 has a viscosity lower than 35 mPa.s at a shearing rate of 1000 s$^{-1}$, but it is preferred for practical reasons that said layer comprises only one such gelatin.

Said antistress layer may contain small particles e.g. matting agents with a mean diameter between 0.2 and 3 $\mu$m in order to improve the diffusion of processing solutions through said antistress layer.

The antistress layer is the surface layer of the imaging element lying on that side of the support that carries the emulsion layer.

The antistress layer and the layer containing the silver halide emulsion have to be in water permeable relationship with said image receiving layer in the imaging element.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

According to the present invention the development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of (a) developing agent(s), and (a) silver halide solvent(s). The developing agent(s) and/or the silver halide solvent(s) can be incorporated in the aqueous alkaline solution and/or in the imaging element.

Preferably a silver halide solvent in the aqueous alkaline solution is used in an amount between 0.05% by weight and 5% by weight and more preferably between 0.5% by weight and 2% by weight.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

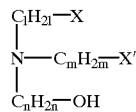

wherein X and X' independently represent hydrogen, a hydroxyl group or an amino group, 1 and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

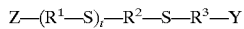

wherein Z and Y each independently represents hydrogen, an alkyl group, an amino group, an ammonium group, a hydroxyl, a sulfo group, a carboxyl, an aminocarbonyl or an aminosulfonyl, $R^1$, $R2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A- 554 585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

Preferred amounts of the hydroquinone-type developing agents are in the range of 0.05 mole to 0.40 mole per liter and preferred amounts of secondary developing agent(s) in the range of $1.8 \times 10^{-3}$ to $2.0 \times 10^{-1}$ mole per liter.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc.. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A- 1 228 927 and in U.S. Pat. No. 4,563,410, 2-mercapto-5-heptyl-oxa-3,4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range from 5 to 7.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image in the image receiving layer an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the aluminum support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

The imaged surface of the hydrophilic surface of a support can be subjected to a chemical treatment that increases the hydrophilicity of the non-silver image parts and the oleophilicity of the silver image.

This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

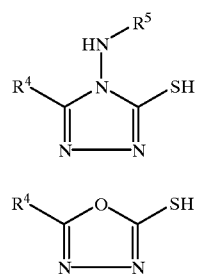

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkish red oil may be added.

Furthermore (a) surface-active compound(s) is preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. No. 4,563,410 is a composition comprising a solution of a mercaptotriazole in a solution of polyethylene oxide with a molecular weight of 4,000. Further suitable finishers have been described in i.a. U.S. Pat. No. 4,062,682 and EP-A- 681 219.

At the moment the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

The following example illustrates the present invention without however, limiting it thereto. All parts, percentages and ratios are by weight unless otherwise indicated.

EXAMPLE 1

A 0,30 mm thick aluminium foil (AA 1050) was degreased by immersing the foil in an aqueous solution containing 25 g/l sodium hydroxide at a temperature of 65° C. The foil was then electrochemically grained using an alternating current in an aqueous solution containing 12 g/l of hydrochloric acid, 7 g of sulphate ion and 7 g/l of aluminum ion at a temperature of 35° C. to form a surface topography with a mean roughness depth of 4 $\mu$m. The aluminium plate was then desmutted with an aqueous solution containing 0.85% of sodium hydroxide at 37° C. for 120 seconds. The foil was subsequently subjected to anodic oxidation in a 15% sulfuric acid aqueous solution containing 1% aluminum ions at 55° C. to form an anodic oxidation film on the front side of 3.0 g/m$^2$ of $Al_2O_3.H_2O$, treated with an aqueous solution containing 10 g/l of $NaHCO_3$ at 45° C. for 30 sec and then rinsed with demineralised water and dried.

Each of the above described steps is separated by a rinsing step to avoid contamination of the liquid used in a particular step with that of the preceding step.

The imaging element I was obtained by coating the grained, anodized and posttreated aluminum support with a silver-receptive stratum containing 2 mg/m$^2$ Ag° as physical development nuclei.

The support with the image receiving layer is then brought in the unwinding area of the machine coating the photosensitive layer at a relative humidity of 20%. An intermediate layer was then provided on the dry silver-receptive stratum from an aqueous composition of polyvinyl alcohol and LEVANYL ROT™ (trade name of Bayer A.G. for a red pigment) in such a way that the resulting dried layer had a weight of 120 mg of polyvinyl alcohol and 250 mg of Levanyl Rot per m$^2$.

At the same time a substantially unhardened photosensitive negative-working cadmium-free orthochromatically sensitized gelatin silver chloroiodide emulsion layer (99.8/0.2 mol %) containing 1 mmole/mole AgX of 4-hydroxy-6-methyl-1,3,3a,7-tetraazaindene and 2.2 mmole/mole AgX of 1-(3-(2-sulphobenzamido))phenyl-5-mercaptotetrazole was coated on the intermediate layer, the silver halide being provided in an amount corresponding to 2.50 g of silver nitrate per m$^2$ and the gelatin content of the emulsion layer being 1.50 g/m$^2$, consisting of 0.7 g/m$^2$ of a gelatin with a viscosity of 21 mpa.s and the remainder of a gelatin with a viscosity of 14 mPa.s.

Finally the photosensitive emulsion layer was overcoated with an antistress layer containing no hardeners comprising 0.7 g/m$^2$ gelatin with a viscosity of 10–12 mPa.s (gelatin K 7598 of Koepff), 60 mg/m$^2$ of LEVANYL ROT™ and 140 mg/m$^2$ of a copolymer of styrene, methyl methacrylate and maleic acid as matting agent with a weight average diameter of 3.5 $\mu$m.

Imaging element II was obtained in an identical way as imaging element I with the exception that the support with the image receiving layer is brought in the unwinding area of the machine coating the photosensitive layer at a relative humidity of 45%.

Imaging element III was obtained in an identical way as imaging element I with the exception that the the support with the image receiving layer is brought in the unwinding area of the machine coating the photosensitive layer at a relative humidity of 80%.

Said imaging elements were placed in contact with a test target and exposed therethrough in a process-camera. In the next step each sample was immersed for 10 s at 24° C. in a freshly made developing solution having the following composition:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-4-methyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 20 s to form a silver image in the image receiving layer.

To remove the developed silver halide emulsion layer, the intermediate layer and the anti-stress layer from the aluminium foil the developed monosheet DTR materials were rinsed for 5 s with a water jet at 40° C. in a LP 82 (tradename of a processor marketed by Agfa-Gevaert, Belgium).

Next, the imaged surfaces of the aluminium foils were treated in a LP 82 (marketed by Agfa-Gevaert, N.V. of Belgium) for 15 s with a finisher at 45° C. to enhance the water-receptivity of the non-image areas and to make the image areas oleophilic ink-receptive. The finisher had the following composition:

| | |
|---|---|
| GEBO ™ ( trade mark for a surfactant sold by Chemische Fabrik Chem-Y, Gmbh, Germany) | 250 mg |
| polyethylene glycol 3000 | 75 g |
| potassium nitrate | 12.5 g |
| citric acid | 20.0 g |
| 2-mercapto-5-heptyl-oxa-3,4-diazole | 2.0 g |
| $NaH_2PO_4.2H_2O$ | 20.0 g |
| 5-bromo-5-nitro-1,3-dioxane | 200 mg |
| sodium hydroxyde | 13.0 g |
| water to make | 1000 ml |
| pH (20° C.) = 5.9 | |

The printing plates thus prepared were used for printing under identical conditions. The printing plates were mounted on the same offset printing machine (HEIDELBERG GTO-46). As fountain solution was used Rotamatic at 50% and as ink K+E 123W from Kast and Ehinger, A.G., Germany. A compressible rubber blanket was used.

The quality of the printing plates was judged by the number and diameter of the white spots in the image areas. The results are given in table 1. A lower number for said items yields of course a better plate.

TABLE 1

| Relative Humidity (in %) | Number of white points/m $^2$ |
|---|---|
| 20 (Imaging Element I) | 26 |
| 45 (Imaging Element II) | 4 |
| 80 (Imaging Element III | 0 |

It is clear from the results in table 1 that the imaging elements I shows a high number of white points where the imaging elements according to the invention II and III show no or only a few white points.

What is claimed is:

1. A method for preparing a silver salt diffusion transfer imaging element comprising the steps of coating in the order given on a grained and anodized side of an aluminum support (i) an image receiving layer containing physical development nuclei, (ii) a photosensitive layer containing a silver halide emulsion in water permeable relationship with said image receiving layer and (iii) optionally an antistress layer in water permeable relationship with said image receiving layer, characterized in that said aluminum support, provided with said image receiving layer, is kept at a relative humidity of at least 45% in an area of a machine, the said area being ahead of a coating head used for coating said photosensitive layer.

2. A method for preparing a silver salt diffusion transfer imaging element according to claim 1 wherein said aluminum support, provided with said image receiving layer, is kept at a relative humidity of at least 55% in said area of said machine.

3. A method for preparing a silver salt diffusion transfer imaging element according to claim 2 wherein said aluminum support support, provided with said image receiving layer, is kept at a relative humidity of at least 60% in said area of said machine.

4. A method for preparing a silver salt diffusion transfer imaging element according to claim 1 wherein said aluminum support, provided with said image receiving layer, is kept at a relative humidity of at least 45% in said area of said machine, for at least 5 s.

5. A method for preparing a silver salt diffusion transfer imaging element according to claim 4 wherein said aluminum support, provided with said image receiving layer, is kept at a relative humidity of at least 45% in said area of said machine, for at least 10 s.

6. A method for preparing a silver salt diffusion transfer imaging element according to claim 1 wherein in said area of said machine, said aluminum support, provided with said image receiving layer, is led over different rollers, at least one roller being conductive and earthened.

7. A method for preparing a lithographic plate comprising the steps of:
   (i) image-wise exposing a silver salt diffusion transfer imaging element prepared according to a method of claim 1;
   (ii) applying an aqueous alkaline solution to the imaging element in the presence of at least one developing agent and at least one silver halide solvent;
   (iii) treating the imaging element to remove the layer(s) on top of said image receiving layer, thereby uncovering a silver image formed in said image receiving layer.

* * * * *